(12) United States Patent
Machida et al.

(10) Patent No.: US 12,345,481 B2
(45) Date of Patent: Jul. 1, 2025

(54) COLD PLATE AND METHOD OF MANUFACTURING COLD PLATE

(71) Applicant: FURUKAWA ELECTRIC CO., LTD., Tokyo (JP)

(72) Inventors: Yuki Machida, Tokyo (JP); Shuta Hikichi, Tokyo (JP); Hirofumi Aoki, Tokyo (JP); Kenya Kawabata, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 18/780,520

(22) Filed: Jul. 23, 2024

(65) Prior Publication Data

US 2025/0044044 A1    Feb. 6, 2025

(30) Foreign Application Priority Data

Jul. 31, 2023  (JP) .................... 2023-124338

(51) Int. Cl.
*F28F 7/00*  (2006.01)
*F28F 3/04*  (2006.01)

(52) U.S. Cl.
CPC .......... *F28F 3/042* (2013.01); *F28F 2255/00* (2013.01)

(58) Field of Classification Search
CPC .............................. F28F 3/042; F28F 2255/00
USPC ....................................................... 165/185
See application file for complete search history.

(56) References Cited

FOREIGN PATENT DOCUMENTS

| JP | H09293809 A | 11/1997 |
|----|----|----|
| JP | H10117077 A | 5/1998 |
| JP | H11314131 A | 11/1999 |
| JP | 2007165481 A | 6/2007 |
| JP | 2013506996 A | 2/2013 |
| JP | 2017073421 A | * 4/2017 |
| JP | 2019186297 A | 10/2019 |
| WO | 2011040938 A1 | 4/2011 |
| WO | WO2013016829 A1 | * 2/2013 |
| WO | WO2023134141 A1 | * 7/2023 |

OTHER PUBLICATIONS

Notice of Reasons for Rejection issued to JP Application No. 2023-124338, mailed Nov. 14, 2023.

* cited by examiner

*Primary Examiner* — Davis D Hwu
(74) *Attorney, Agent, or Firm* — CKC & Partners Co., LLC

(57) ABSTRACT

Provided is a cold plate that can improve cooling efficiency and simultaneously suppress an increase in size in the thickness direction. A heat-transfer-medium flow space 2 is formed between a heat dissipation surface of a base plate and a cover plate, the base plate has a plurality of heat transfer portions 14 that are provided so as protrude from the heat dissipation surface toward the cover plate 20 and that transfer, to a heat-transfer medium flowing through the heat-transfer-medium flow space 2, heat released from the heat dissipation surface, and concave portions 22, into which at least a portion of tips of the plurality of heat transfer portions 14 are inserted, are formed in a surface of the cover plate facing the heat-transfer-medium flow space.

6 Claims, 10 Drawing Sheets

COLD PLATE AND METHOD OF MANUFACTURING COLD PLATE

This application is based on and claims the benefit of priority from Japanese Patent Application No. 2023-124338, filed on 31 Jul. 2023, the content of which is incorporated herein by reference.

BACKGROUND OF THE INVENTION

Field of the Invention

The present disclosure relates to a cold plate used in cooling an object to be cooled such as an electronic component, and a method of manufacturing the cold plate.

Related Art

A cold plate described in Japanese Unexamined Patent Application (Translation of PCT application), Publication No. 2013-506996 is known as a conventional cold plate. This cold plate has therein a heat-transfer-medium flow space, through which a heat-transfer medium flows, and releases, to a heat-transfer medium flowing through the heat-transfer-medium flow space, heat released from an object to be cooled, and includes: a base plate provided with, on a surface, a heat absorbing surface for absorbing the heat released from the object to be cooled and provided with, on another surface, a heat dissipation surface for releasing, to the heat-transfer medium flowing through the heat-transfer-medium flow space, the heat absorbed by the heat absorbing surface; and a cover plate covering the heat dissipation surface of the base plate. The base plate has a plurality of heat transfer portions that are provided so as to protrude from the heat dissipation surface toward the cover plate and that transfer, to the heat-transfer medium flowing through the heat-transfer-medium flow space, the heat released from the heat dissipation surface.

For the cold plate described in Japanese Unexamined Patent Application (Translation of PCT application), Publication No. 2013-506996, in a case in which a gap is formed between tips of the plurality of the heat transfer portions and a surface of the cover plate facing a heat-transfer-medium flow space the heat-transfer medium flowing through the heat-transfer-medium flow space flows more easily through the gap between the tips of the plurality of the heat transfer portions and the cover plate than the gaps between the heat transfer portions. For this reason, in the cold plate described in Japanese Unexamined Patent Application (Translation of PCT application), Publication No. 2013-506996, the heat-transfer medium that has flowed through the heat-transfer-medium flow space flows out of the heat-transfer-medium flow space without sufficiently absorbing heat from the heat transfer portions, and thus it is not possible to improve the cooling efficiency.

To address the above situation, Japanese Unexamined Patent application, Publication No. 2019-186297 describes a cold plate in which the flow of a heat-transfer medium through a gap between tips of a plurality of heat transfer portions and a surface of a cover plate facing the heat-transfer-medium flow space is restricted by disposing a joining member between the tips of the plurality of the heat transfer portions and the surface of the cover plate facing the heat-transfer-medium flow space, thereby improving cooling efficiency.

Patent Document 1: Japanese Unexamined Patent Application (Translation of PCT application), Publication No. 2013-506996
Patent Document 2: Japanese Unexamined Patent Application, Publication No. 2019-186297

SUMMARY OF THE INVENTION

However, in the cold plate described in Japanese Unexamined Patent Application, Publication No. 2019-186297, due to the joining member disposed between the tips of the plurality of the heat transfer portions and the surface of the cover plate facing the heat-transfer-medium flow space, the height dimension of the plurality of the heat transfer portions is small, and the contact area between the heat transfer portions and the heat-transfer medium flowing through the heat-transfer-medium flow space is small, whereby there is a possibility of the cooling capacity being lowered. Further, in a case in which the heat transfer portions in the cold plate described in Japanese Unexamined Patent Application, Publication No. 2019-186297 have a height dimension that enables the cold plate to exhibit a necessary cooling capacity, the dimension of the entire cold plate in the thickness direction increases.

An object of the present disclosure is to provide a cold plate that can improve cooling efficiency and simultaneously suppress an increase in size in the thickness direction, and a method of manufacturing the cold plate.

A cold plate according to the present disclosure that has therein a heat-transfer-medium flow space, through which a heat-transfer medium flows, and that releases, to the heat-transfer medium flowing through the heat-transfer-medium flow space, heat absorbed from an object to be cooled, the cold plate including: a base plate provided with, on a surface, a heat absorbing surface that absorbs heat released from the object to be cooled and provided with, on another surface, a heat dissipation surface that releases, to the heat-transfer medium flowing through the heat-transfer-medium flow space, the heat absorbed by the heat absorbing surface; and a cover plate that covers the heat dissipation surface of the base plate. The heat-transfer-medium flow space is formed between the heat dissipation surface of the base plate and the cover plate. The base plate has a plurality of heat transfer portions that are provided so as to protrude from the heat dissipation surface toward the cover plate and that transfer, to the heat-transfer medium flowing through the heat-transfer-medium flow space, the heat released from the heat dissipation surface. Concave portions, into which at least a portion of tips of the plurality of heat transfer portions are inserted, are formed in a surface of the cover plate facing the heat-transfer-medium flow space.

In the cold plate according to the present disclosure, it is preferable that the tip portions of the heat transfer portions have a tapered shape.

In the cold plate according to the present disclosure, it is preferable that each of the plurality of heat transfer portions is configured as a fin that extends along a flow direction of the heat-transfer medium flowing through the heat-transfer-medium flow space.

Further, in the cold plate according to the present disclosure, it is preferable that the base plate has a base-side joining portion that is provided so as to extend along an outer periphery of the base plate and to which the cover plate is joined, and the heat dissipation surface protrudes further toward the cover plate than the base-side joining portion.

A method of manufacturing a cold plate according to the present disclosure that has therein a heat-transfer-medium flow space, through which a heat-transfer medium flows, and that releases, to the heat-transfer medium flowing through the heat-transfer-medium flow space, heat absorbed from an object to be cooled, the method comprising: a plate stacking step of stacking, on a base plate, a cover plate that covers a heat dissipation surface, the base plate being provided with, on a surface, a heat absorbing surface that absorbs heat released from the object to be cooled, being provided with, on another surface, the heat dissipation surface that releases, to the heat-transfer medium flowing through the heat-transfer-medium flow space, heat absorbed by the heat absorbing surface, and being provided with a plurality of heat transfer portions that are provided so as to protrude from the heat dissipation surface toward the cover plate and that transfer, to the heat-transfer medium flowing through the heat-transfer-medium flow space, the heat released from the heat dissipation surface; and a plate pressing step of pushing at least a portion of tips of the plurality of heat transfer portions into a surface of the cover plate facing the heat dissipation surface and positioning at least the portion of the tips of the heat transfer portions into concave portions by pressing the base plate and the cover plate against each other in a state in which the cover plate has been stacked on the base plate in the plate stacking step.

It is preferable that the method of manufacturing the cold plate according to the present disclosure further includes: a heat transfer portion forming step of forming tip portions of the heat transfer portions into a tapered shape.

It is preferable that the method of manufacturing the cold plate according to the present disclosure further includes: a heat transfer portion forming step of forming the plurality of heat transfer portions into fin shapes that extend along a flow direction of the heat-transfer medium flowing through the heat-transfer-medium flow space.

It is preferable that the method of manufacturing the cold plate according to the present disclosure further includes: a base-side joining portion forming step of forming the base-side joining portion so as to extend along an outer periphery of the base plate and to protrude less than the heat dissipation surface toward the cover plate, and a joining step of joining the cover plate to the base-side joining portion.

According to the present disclosure, it is possible to reduce or eliminate the gap between the tips of the heat transfer portions and the surface of the cover plate facing the heat-transfer-medium flow space, and thus it is possible to reduce a flow amount of the heat-transfer medium adjacent to the cover plate in the heat-transfer-medium flow space and increase the flow amount of the heat-transfer medium between adjacent heat transfer portions, and it is possible to improve the cooling efficiency. Further, it is possible to suppress an increase in size in the thickness direction, and thus it is possible to reduce the space required for installation of the cold plate, reduce materials used to manufacture the cold plate, and reduce the weight of the cold plate.

DETAILED DESCRIPTION OF THE INVENTION

Figure 1:
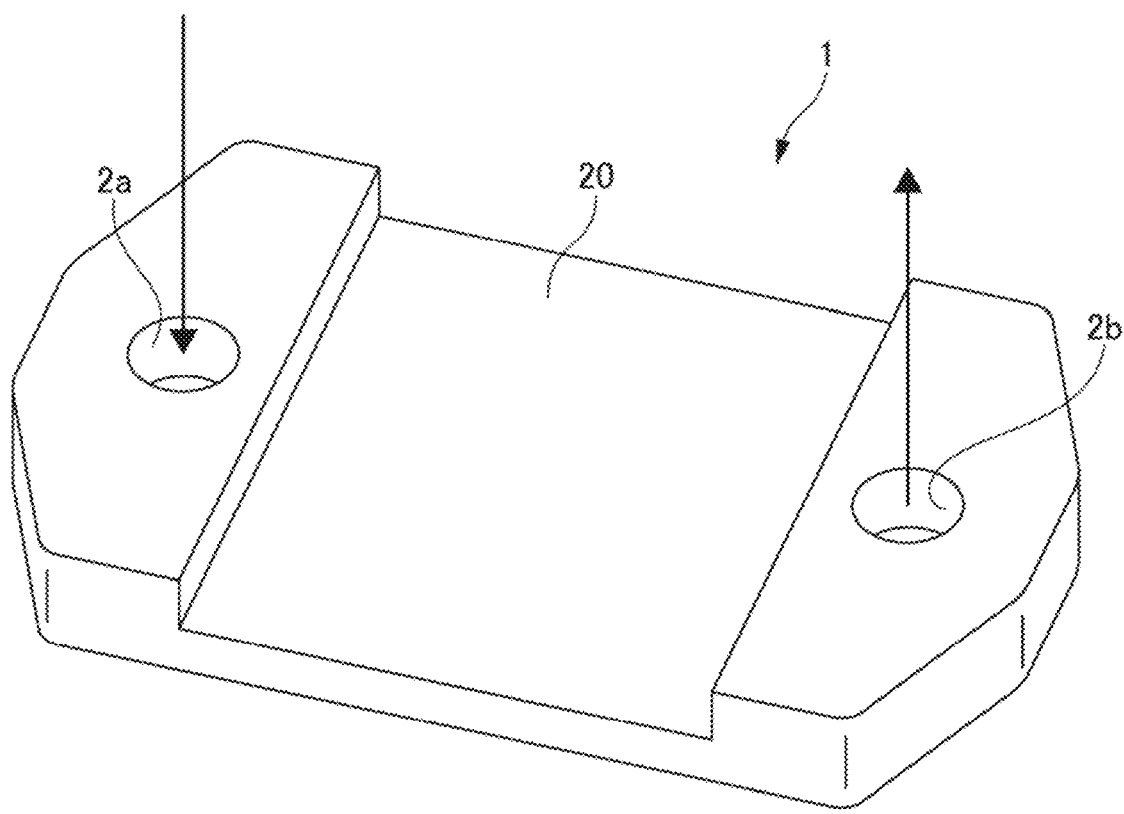
FIG. 1 is an overall perspective view of a cold plate according to an embodiment of the present disclosure.
Figure 2:
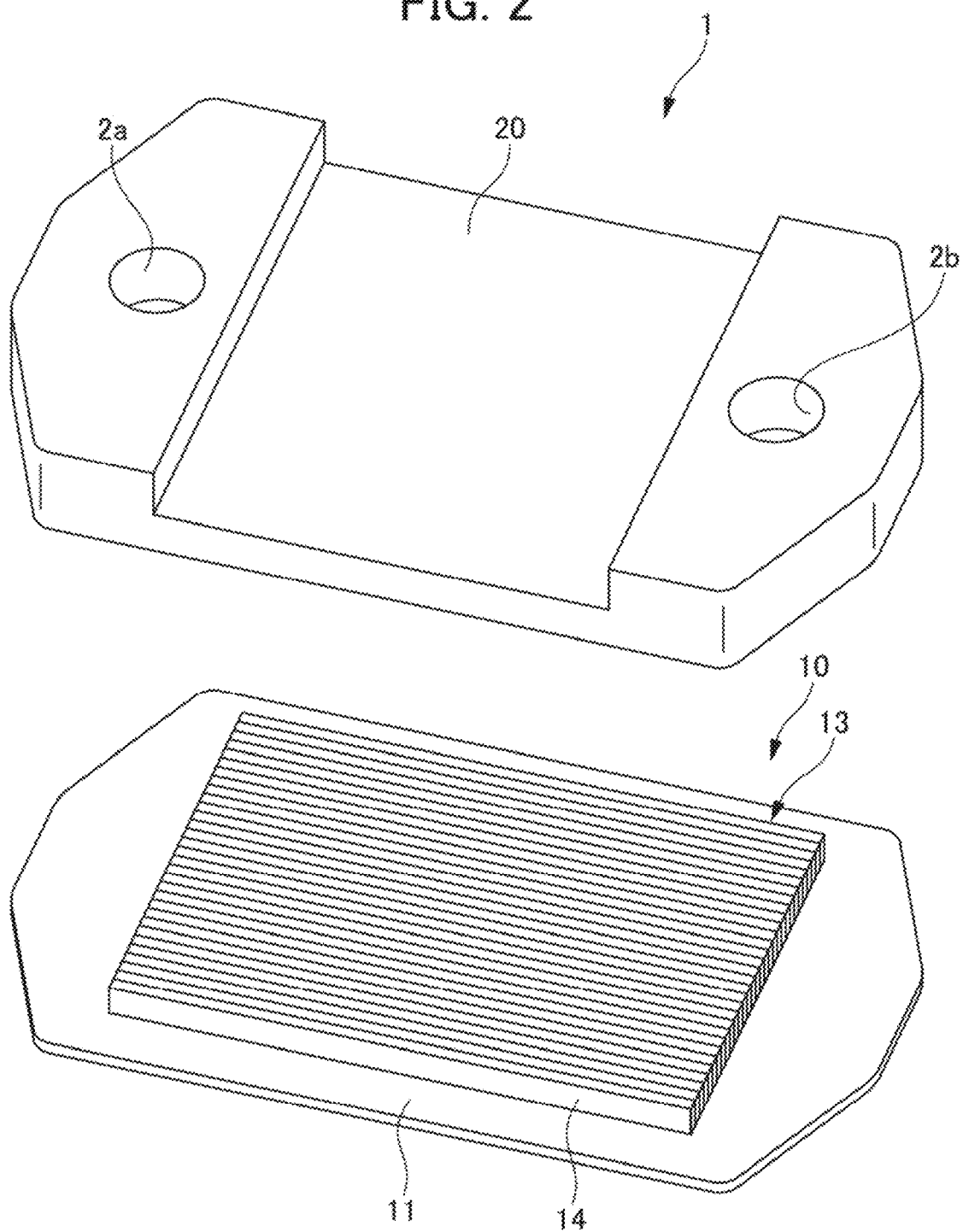
FIG. 2 is an exploded perspective view of the cold plate according to the embodiment of the present disclosure, as viewed from a cover plate side.
Figure 3:
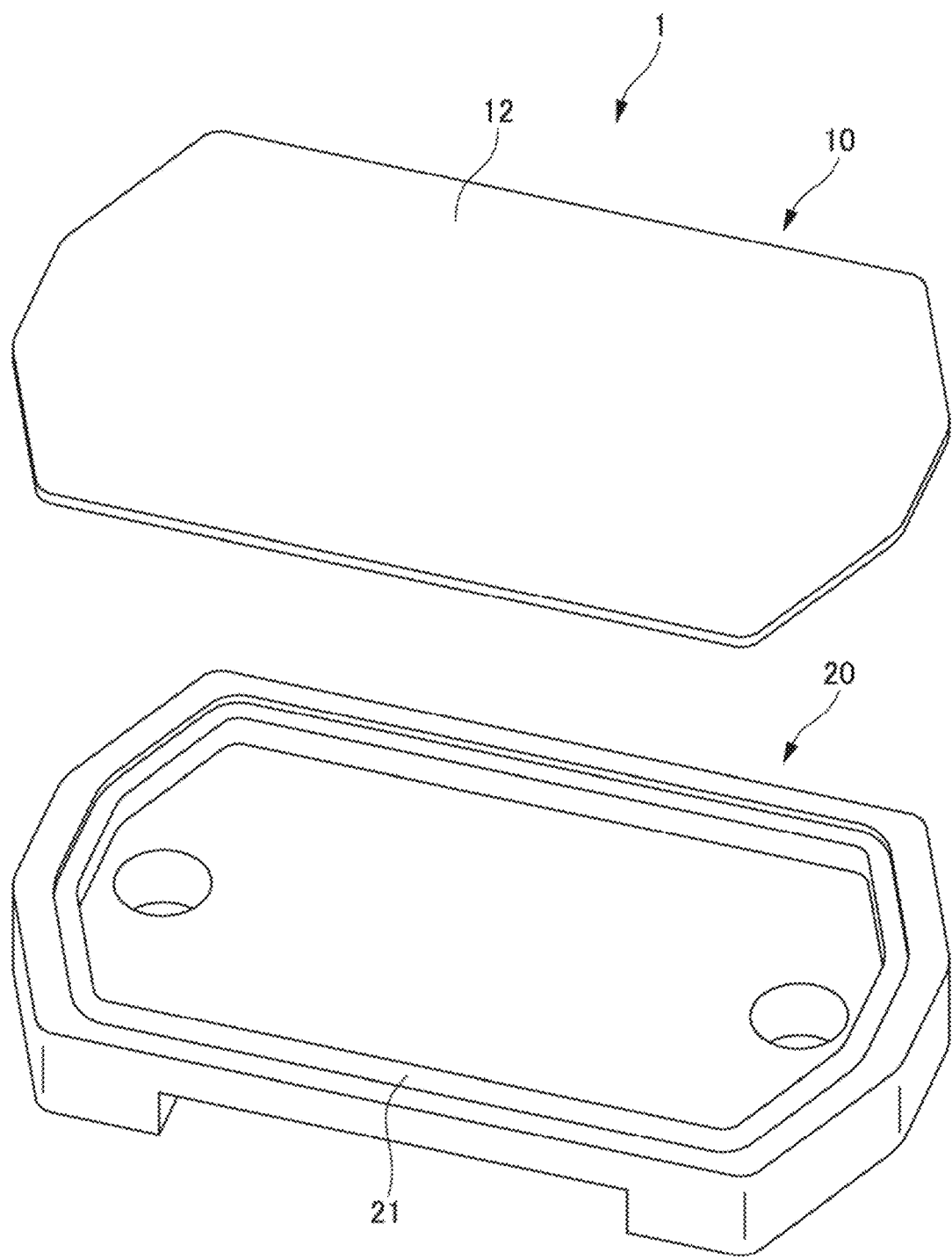
FIG. 3 is an exploded perspective view of the cold plate according to the embodiment of the present disclosure, as viewed from a base plate side.
Figure 4:
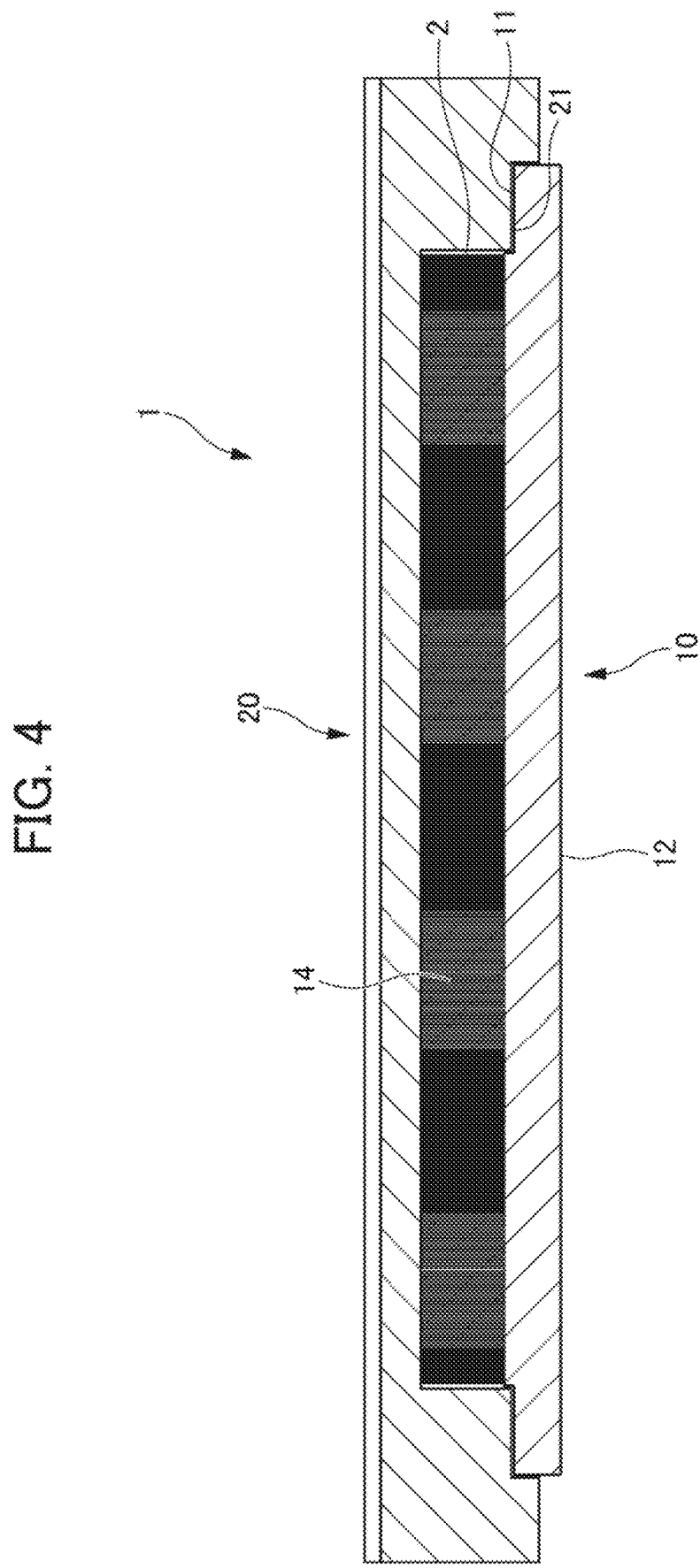
FIG. 4 is a side cross-sectional view of the cold plate according to the embodiment of the present disclosure.
Figure 5:
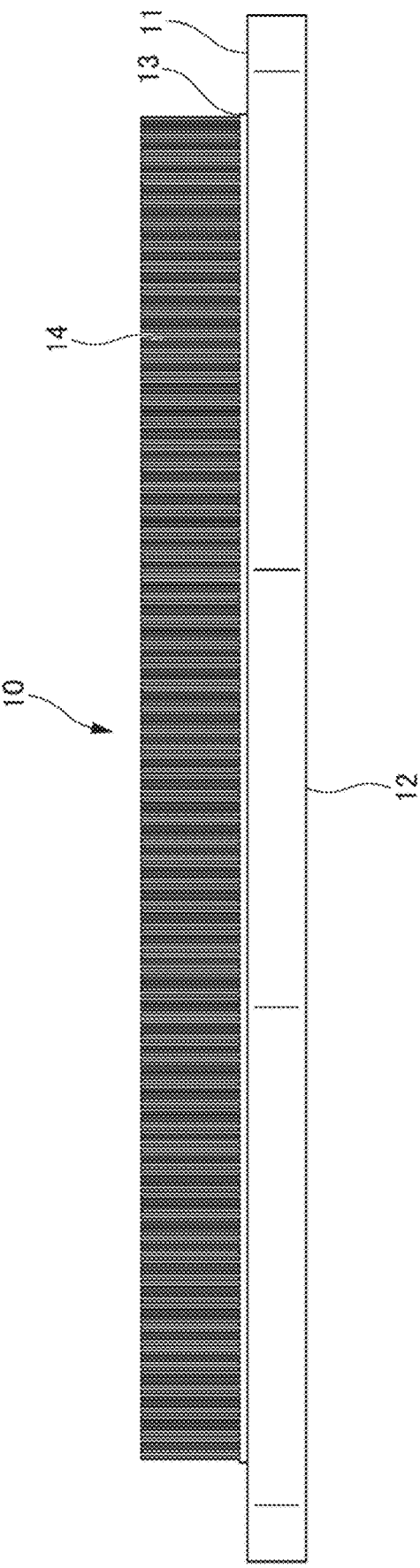
FIG. 5 is a side view of a base plate according to the embodiment of the present disclosure.
Figure 6:
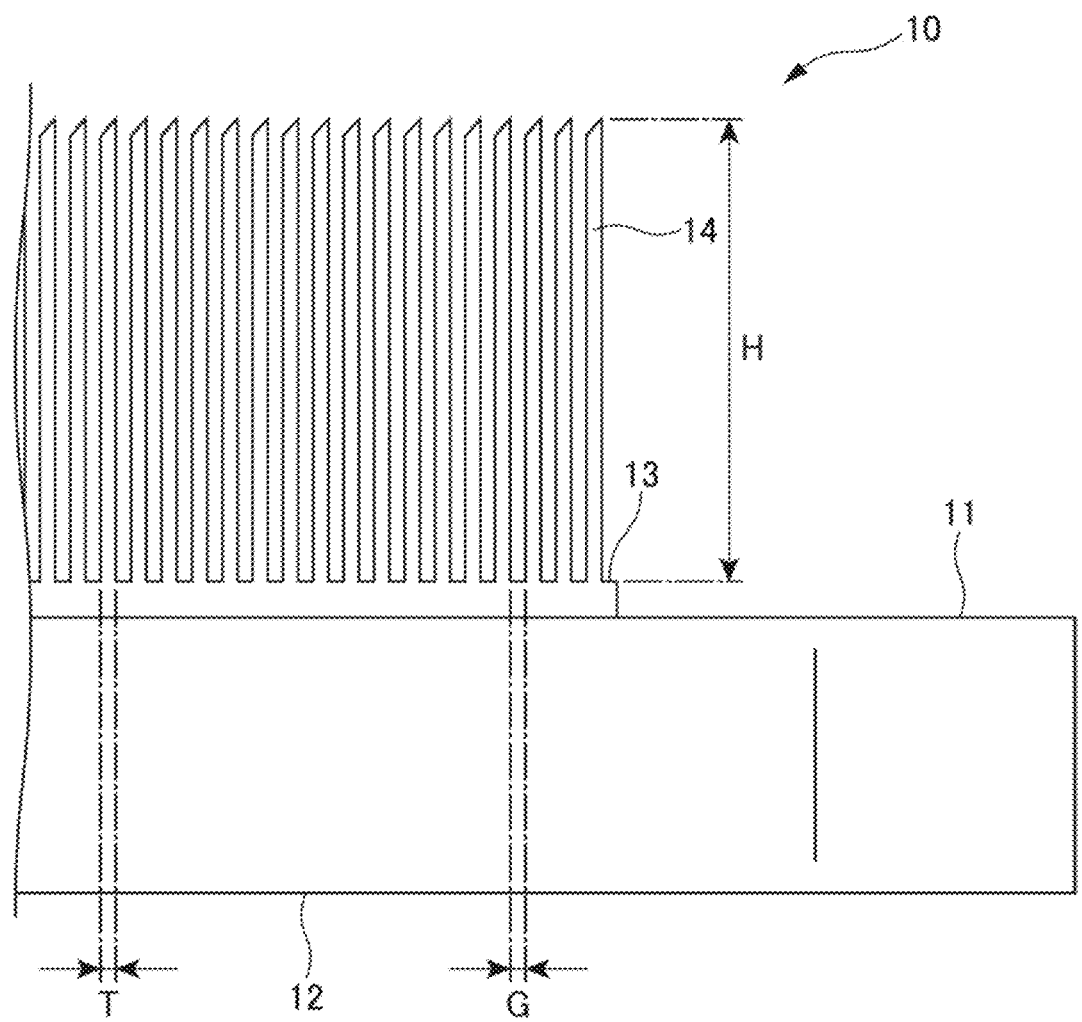
FIG. 6 is a side view of a main part of the base plate according to the embodiment of the present disclosure.
Figure 7:
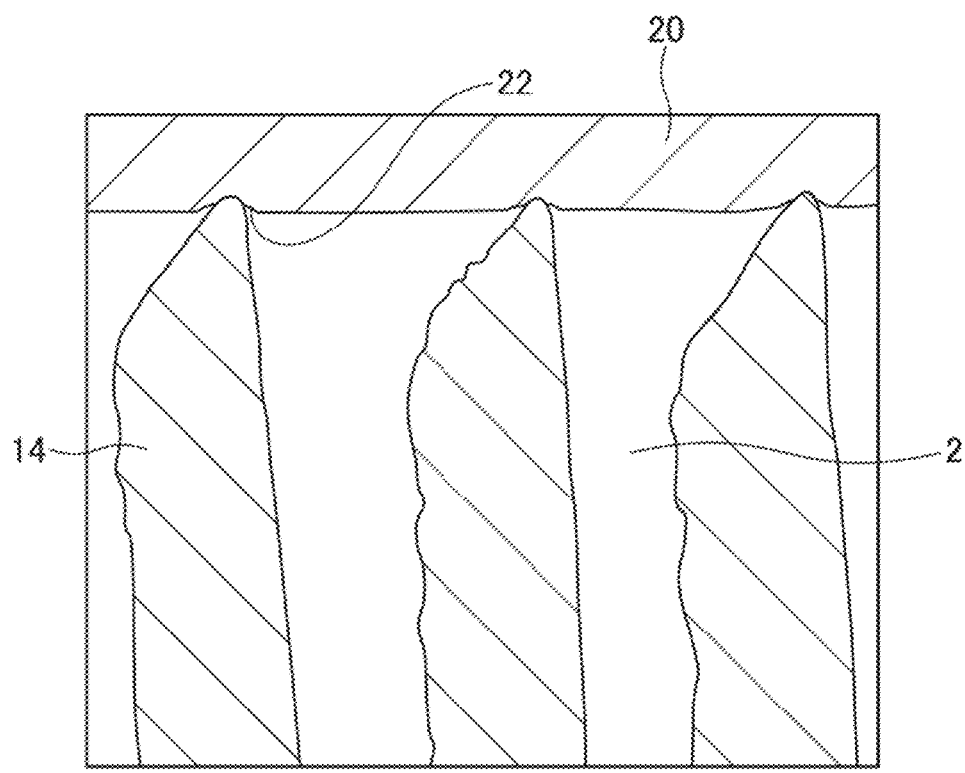
FIG. 7 is a side cross-sectional view of a main part of the cold plate according to the embodiment of the present disclosure.
Figure 8:
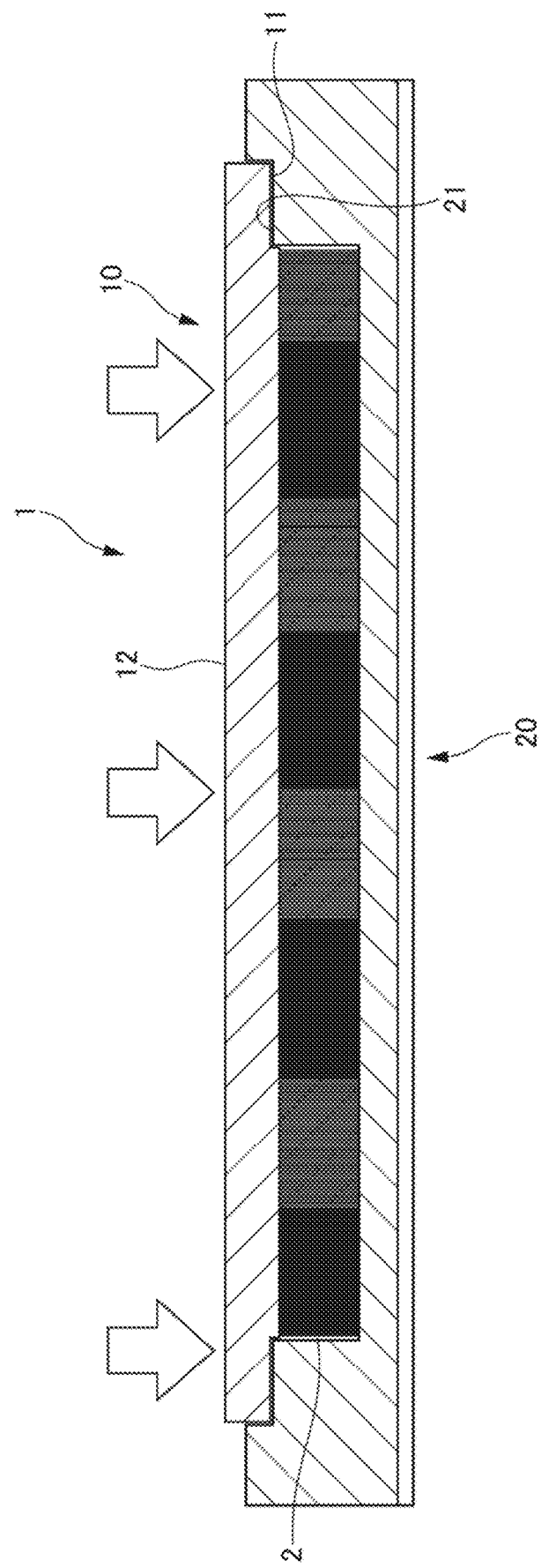
FIG. 8 is a side cross-sectional view, and illustrates a method of manufacturing the cold plate according to the embodiment of the present disclosure.
Figure 9A:
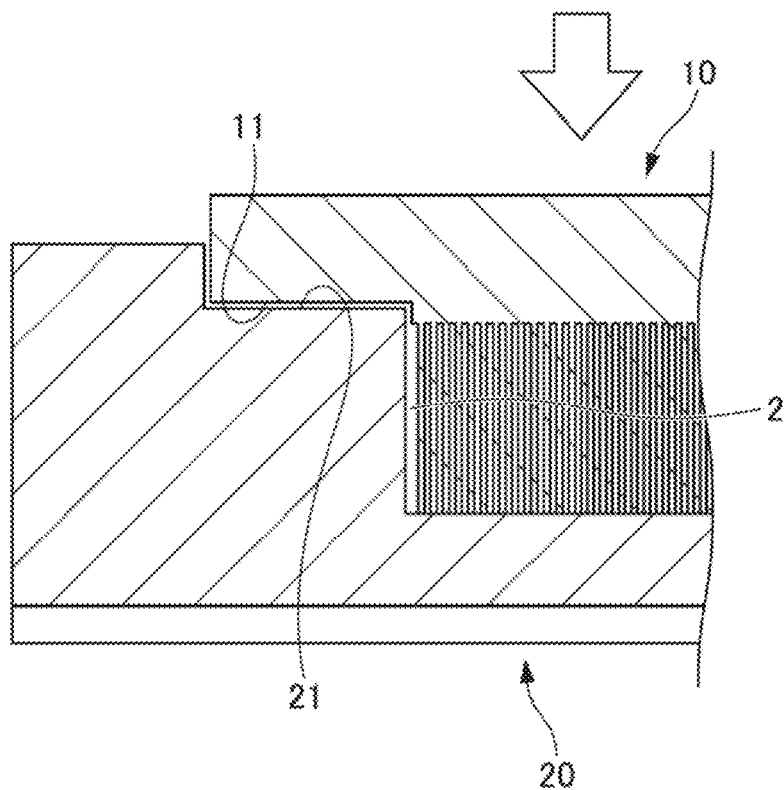
FIGS. 9A and 9B are side cross-sectional views of a main part, and illustrate the method of manufacturing the cold plate according to the embodiment of the present disclosure.
Figure 9B:
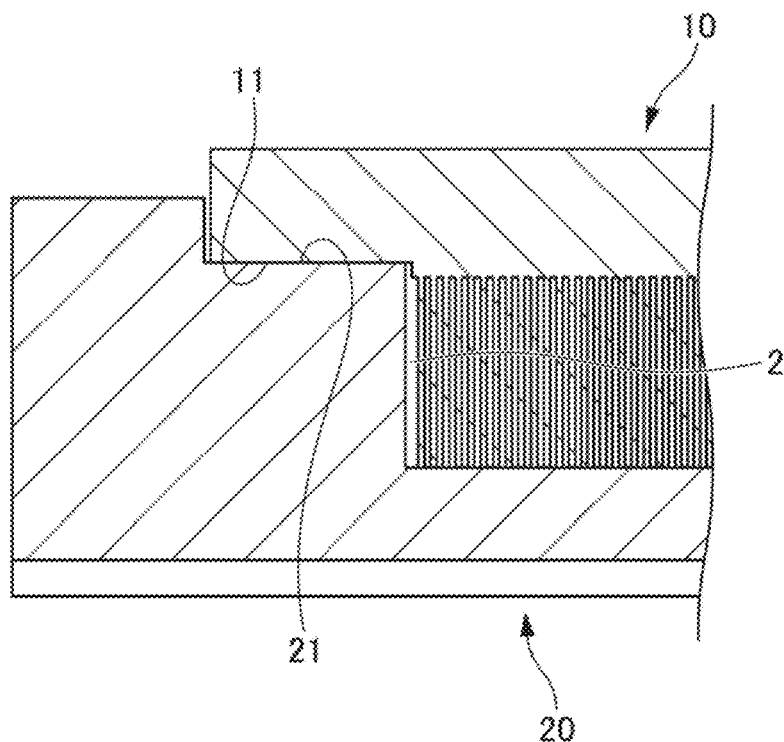

FIGS. 1 to 9 illustrate an embodiment of the present disclosure. FIG. 1 is an overall perspective view of a cold plate, FIG. 2 is an exploded perspective view of the cold plate as viewed from a cover plate side, FIG. 3 is an exploded perspective view of the cold plate as viewed from a base plate side, FIG. 4 is a side cross-sectional view of the cold plate, FIG. 5 is a side view of a base plate, FIG. 6 is a side view of a main part of the base plate, FIG. 7 is a side cross-sectional view of a main part of the cold plate, FIG. 8 is a side cross-sectional view illustrating a method of manufacturing the cold plate, and FIGS. 9A and 9B are side cross-sectional views of a main part, and illustrate the method of manufacturing the cold plate.

The cold plate 1 of the present embodiment is used, for example, to cool an object to be cooled such as an electronic component that generates heat. As illustrated in FIGS. 1 and 4, the cold plate 1 is provided therein with a heat-transfer medium inlet 2a through which a heat-transfer medium flows into a heat-transfer-medium flow space 2, and a heat-transfer medium outlet 2b through which the heat-transfer medium that has flowed through the heat-transfer-medium flow space 2 flows out. The cold plate 1 is used while a heat-transfer medium supply pipe (not shown) is connected to the heat-transfer medium inlet 2a and a heat-transfer medium discharge pipe (not shown) is connected to the heat-transfer medium outlet 2b. The cold plate 1 causes the heat-transfer medium that has been cooled to flow into the heat-transfer-medium flow space 2 via the heat-transfer medium inlet 2a, causes the heat-transfer medium in the heat-transfer-medium flow space 2 to absorb heat released from the object to be cooled, and causes the heat-transfer medium that has absorbed the heat in the heat-transfer-medium flow space 2 to flow out of the heat-transfer-medium flow space 2 via the heat-transfer medium outlet 2b. Here, for example, water is used as the heat-transfer medium.

As illustrated in FIGS. 2 to 4, the cold plate 1 includes a base plate 10 and a cover plate 20 that are superposed on, and joined to, each other by brazing or the like.

The base plate 10 is a substantially rectangular plate-shaped member made of a metal that has a high thermal conductivity, such as copper, a copper alloy, aluminum, or stainless steel. As illustrated in FIGS. 2 and 3, the base plate 10 includes a base-side joining portion 11 to which the cover plate 20 is joined, a heat absorbing surface 12 that absorbs the heat released from the object to be cooled, a heat dissipation surface 13 that releases, to the heat-transfer medium flowing through the heat-transfer-medium flow space 2, the heat absorbed by the heat absorbing surface 12, and a plurality of heat transfer portions 14 that are provided so as to protrude from the heat dissipation surface 13, and transfer, to the heat-transfer medium flowing through the heat-transfer-medium flow space 2, the heat released from the heat dissipation surface 13.

The base-side joining portion 11 is formed, in a circumferential direction, along an outer periphery of a surface of the base plate 10 facing the cover plate 20.

The heat absorbing surface 12 is a surface on which the object to be cooled is placed, and is provided on an outer side of the base plate 10 in a stacking direction.

The heat dissipation surface 13 is a flat surface positioned inside an inner periphery of the base-side joining portion 11, and the entirety of the heat dissipation surface 13 protrudes further toward the cover plate 20 than the base-side joining portion 11.

The plurality of heat transfer portions 14 are formed together with the heat dissipation surface 13 by, for example, skiving the surface of the base plate 10 facing the cover plate 20 side. Each of the plurality of heat transfer portions 14 is configured as a fin that protrudes from the heat dissipation surface 13 and extends in a flow direction of the heat-transfer medium flowing through the heat-transfer-medium flow space 2. As illustrated in FIG. 6, each of the plurality of heat transfer portions 14 has, for example, a height dimension H of 3 mm, a thickness dimension T of 0.1 mm, and an interval G of 0.1 mm between adjacent heat transfer portions 14. The tip portion of each of the plurality of heat transfer portions 14 has a tapered shape in which the thickness dimension T decreases toward a point substantially throughout the heat-transfer-medium flow space 2 in the flow direction of the heat-transfer medium. In addition, the height dimension H of each of the plurality of heat transfer portions 14 includes a slight error of, for example, 0.05 mm.

The cover plate 20 is a plate-like member made of a metal having a high thermal conductivity, such as copper, a copper alloy, aluminum, or stainless steel. The cover plate 20 has a cover-side joining portion 21 that is provided so as to extend along the outer periphery of the cover plate 20 and that joins to the base plate 10 in a state in which the cover plate is superposed on the base plate 10, and a portion inside an inner periphery of the cover-side joining portion 21 is formed in a concave shape. Upon the base-side joining portion 11 and the cover-side joining portion 21 joining to each other, the heat-transfer-medium flow space 2 is formed between the heat dissipation surface 13 of the base plate 10 and the cover plate 20. Further, in the cover plate 20, the heat-transfer medium inlet 2a is formed at an end portion in a longitudinal direction, and the heat-transfer medium outlet 2b is formed at another end portion in the longitudinal direction.

Further, in the state in which the base-side joint portion 11 and the cover-side joint portion 21 are joined to each other, the tips of the plurality of heat transfer portions 14 are inserted into concave portions 22 provided in a surface on the heat-transfer-medium flow space 2 side of the cover plate 20 as illustrated in FIG. 7. The concave portions 22 are formed by pushing the tips of the plurality of heat transfer portions 14 into the surface of the cover plate 20 facing the heat dissipation surface 13. It is not necessary for the concave portions 22 in the cover plate 20 to be provided at positions corresponding to all the tips of the plurality of heat transfer portions 14, and the concave portions 22 may be provided at positions corresponding to at least a portion of the tips of the plurality of heat transfer portions 14.

The cold plate 1 that is configured as described above causes the heat-transfer medium to flow into the heat-transfer-medium flow space 2 via the heat-transfer medium inlet 2a while the object to be cooled is placed on the heat absorbing surface 12 of the base plate 10 and causes the heat-transfer medium that has flowed through the heat-transfer-medium flow space 2 to flow out of the heat-transfer-medium flow space 2 via the heat-transfer medium outlet 2b.

During the process described above, the heat released from the object to be cooled is absorbed by the heat absorbing surface 12 of the base plate 10, transferred from the heat absorbing surface 12 to the heat dissipation surface 13 and the plurality of heat transfer portions 14, and released to the heat-transfer medium flowing through the heat-transfer-medium flow space 2. With this configuration, it is possible for the object to be cooled to release the heat to the heat-transfer medium flowing through the heat-transfer-medium flow space 2 and be continuously cooled.

The heat-transfer medium flowing into the heat-transfer-medium flow space 2 flows between the heat transfer portions 14 without flowing through the gap between the tips of the plurality of heat transfer portions 14 and the cover plate 20, and efficiently absorbs the heat released from the heat transfer portions 14.

Further, a method of manufacturing the cold plate 1 described above includes the following steps.

In a base-side joining portion forming step, cutting or the like is performed so that the base-side joining portion 11 is formed so as to extend along an outer periphery of the base plate 10 and protrude less than the heat dissipation surface 13.

In a heat transfer portion forming step, skiving is performed to form the plurality of heat transfer portions 14 together with the heat dissipation surface 13 of the base plate. The heat transfer portion forming step includes forming each of the plurality of heat transfer portions 14 into a fin shape that extends along the flow direction of the heat-transfer medium flowing through the heat-transfer-medium flow space and forming each of the tip portions of the plurality of heat transfer portions 14 into a tapered shape substantially throughout the heat-transfer-medium flow space 2 in the flow direction of the heat-transfer medium.

In a plate stacking step, the cover plate 20 is stacked on the base plate 10 on which the base-side joining portion 11 has been formed in the base-side joining portion forming step and on which the plurality of heat transfer portions 14 together with the heat dissipation surface 13 have been formed in the heat transfer portion forming step.

In a plate pressing step as illustrated in FIGS. 8 and 9, the base plate 10 and the cover plate 20 that have been stacked in the plate stacking step are pressed against each other in the stacking direction to push at least a portion of the tips of the plurality of heat transfer portions 14 into the surface of the cover plate 20 facing the heat dissipation surface 13, thereby forming the concave portions 22.

In a joining step, the cover-side joining portion 21 of the cover plate 20 is joined to the base-side joining portion 11 of the base plate 10 by brazing in the state in which the heat transfer portions 14 have been inserted into the concave portions 22 of the surface of the cover plate 20 facing the heat dissipation surface 13 that have been formed in the plate pressing step.

As described above, the cold plate 1 according to the present embodiment has therein the heat-transfer-medium flow space 2, through which the heat-transfer medium flows, and that releases, to the heat-transfer medium flowing through the heat-transfer-medium flow space 2, the heat absorbed from the object to be cooled. The cold plate 1 includes: the base plate 10 provided with, on the surface, the heat absorbing surface 12 that absorbs the heat released from the object to be cooled and provided with, on the other surface, the heat dissipation surface 13 that releases, to the heat-transfer medium flowing through the heat-transfer-medium flow space 2, the heat absorbed by the heat absorbing surface 12; and the cover plate 20 that covers the heat dissipation surface 13 of the base plate 10. The heat-transfer-medium flow space 2 is formed between the heat dissipation surface 13 of the base plate 10 and the cover plate 20. The base plate 10 has the plurality of heat transfer portions 14 that are provided so as to protrude from the heat dissipation surface 13 toward the cover plate 20 and that transfer, to the heat-transfer medium flowing through the heat-transfer-medium flow space 2, the heat released from the heat dissipation surface 13. The concave portions 22, into which at least a portion of tips of the plurality of heat transfer portions 14 are inserted, are formed in a surface of the cover plate 20 facing the heat-transfer-medium flow space 2.

Further, the present embodiment provides a method of manufacturing the cold plate 1. The method of manufacturing the cold plate 1, that has therein the heat-transfer-medium flow space 2, through which the heat-transfer medium flows, and that releases, to the heat-transfer medium flowing through the heat-transfer-medium flow space 2, the heat absorbed from the object to be cooled, includes: the plate stacking step of stacking, on the base plate 10, the cover plate 20 that covers the heat dissipation surface 13, the base plate 10 being provided with, on the surface, the heat absorbing surface 12 that absorbs the heat released from the object to be cooled, being provided with, on the other surface, the heat dissipation surface 13 that releases, to the heat-transfer medium flowing through the heat-transfer-medium flow space 2, the heat absorbed by the heat absorbing surface 12, and being provided with the plurality of heat transfer portions 14 that are provided so as to protrude from the heat dissipation surface 13 toward the cover plate 20 and that transfer, to the heat-transfer medium flowing through the heat-transfer-medium flow space 2, the heat released from the heat dissipation surface 13; and the plate pressing step of pushing at least a portion of the tips of the plurality of heat transfer portions 14 into the surface of the cover plate 20 facing the heat dissipation surface 13 and positioning at least the portion of the tips of the heat transfer portions 14 into the concave portions 22 by pressing the base plate 10 and the cover plate 20 against each other in a state in which the cover plate 20 has been stacked on the base plate 10 in the plate stacking step.

Due to the features described above, it is possible to reduce or eliminate the gap between the tips of the heat transfer portions 14 and the surface of the cover plate 20 facing the heat-transfer-medium flow space 2, and thus it is possible to reduce a flow amount of the heat-transfer medium adjacent to the cover plate 20 side in the heat-transfer-medium flow space 2 and increase the flow amount of the heat-transfer medium between the adjacent heat transfer portions 14, and it is possible to improve the cooling efficiency. Further, it is possible to suppress an increase in size in the thickness direction, and thus it is possible to reduce the space required for installation of the cold plate 1, reduce materials used to manufacture the cold plate 1, and reduce the weight of the cold plate 1.

According to the cold plate 1 of the present embodiment, it is preferable that the tip portions of the heat transfer portions 14 have a tapered shape.

Further, according to the method of manufacturing the cold plate of the present embodiment, it is preferable that the method includes the heat transfer portion forming step of forming the tip portions of the heat transfer portions 14 into a tapered shape.

Due to the above features, it is possible to easily push the tips of the heat transfer portions 14 into the surface of the cover plate 20 facing the heat dissipation surface 13, and thus it is possible to more reliably position the tips of the heat transfer portions 14 into the concave portions 22.

According to the cold plate 1 of the present embodiment, it is preferable that each of the plurality of heat transfer portions 14 is configured as a fin that extends along the flow direction of the heat-transfer medium flowing through the heat-transfer-medium flow space 2.

According to the method of manufacturing the cold plate 1 of the present embodiment, it is preferable that the method includes a heat transfer portion forming step of forming the plurality of heat transfer portions 14 into fin shapes that extend along the flow direction of the heat-transfer medium flowing through the heat-transfer-medium flow space 2.

Due to the features described above, it is possible to dispose the heat transfer portions 14 substantially throughout the heat-transfer medium flow space 2 in the flow direction of the heat-transfer medium, and thus it is possible to more efficiently transfer heat from the heat transfer portions 14 to the heat-transfer medium.

According to the cold plate of the present embodiment, it is preferable that the base plate 10 has the base-side joining portion 11 that is provided so as to extend along the outer periphery of the base plate and to which the cover plate 20 is joined, and that the heat dissipation surface 13 protrudes further toward the cover plate 20 than the base-side joining portion 11.

Further, according to the method of manufacturing the cold plate 1 of the present embodiment, it is preferable that the method includes the base-side joining portion forming step of forming the base-side joining portion 11 so as to extend along an outer periphery of the base plate 10 and to protrude less than the heat dissipation surface 13 toward the cover plate 20, and the joining step of joining the cover plate 20 to the base-side joining portion 11.

Due to the features described above, it is possible, in a case in which the cover plate 20 is joined to the base plate 10 by brazing, to restrict any inflow of brazing material toward the heat dissipation surface 13, and thus it is possible to suppress clogging of the heat-transfer-medium flow space 2 due to the brazing material.

Figure 10A:
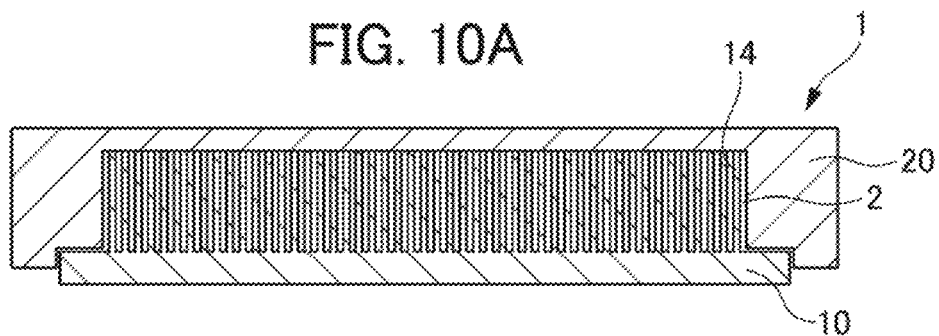
FIGS. 10A to 10E are side cross-sectional views of the cold plate according to another embodiment of the present disclosure.
Figure 10B:
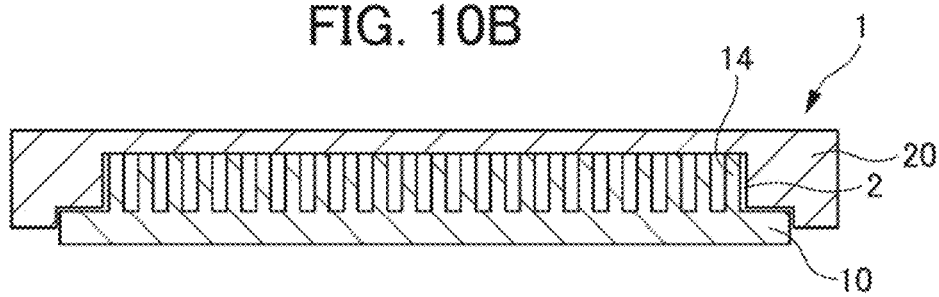

In the above-described embodiment, an example has been described in which each of the plurality of heat transfer portions 14 is configured as a fin that has the height dimension H of 3 mm, the thickness dimension T of 0.1 mm, and the interval G of 0.1 mm between the adjacent heat transfer portions 14, but the present disclosure is not limited thereto. For each of the plurality of heat transfer portions, it is possible to arbitrarily set the height dimension H, the thickness dimension T, and the interval G between the adjacent heat transfer portions as illustrated in FIGS. 10A and 10B.

Figure 10C:
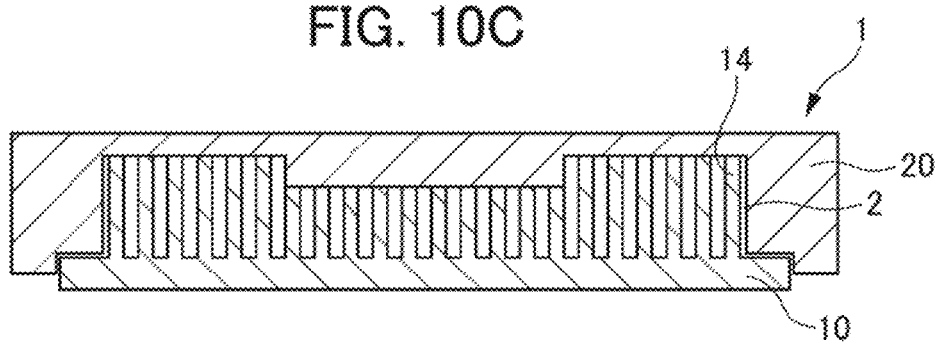
Figure 10D:
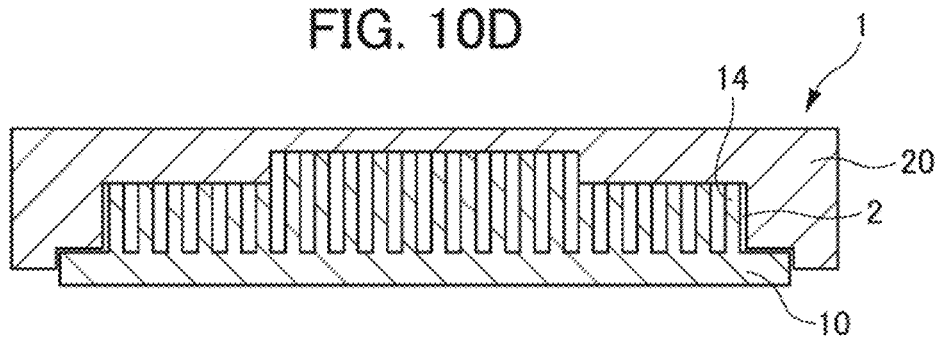

Further, not all of the tips of the plurality of heat transfer portions 14 have to be inserted into the concave portions 22 formed in the cover plate 20, and at least a portion of the tips of the plurality of heat transfer portions 14 may be inserted into the recessed portions 22. For example, as illustrated in FIG. 10C, the cover plate 20 may be formed such that the thickness dimension is larger at a central portion of the heat-transfer-medium flow space 2 in a width direction than at both outer portions of the heat-transfer-medium flow space 2 in the width direction and such that, and tips of the heat transfer portions 14 positioned on at the central portion of the heat-transfer-medium flow space 2 in the width direction may be inserted into the concave portions 22. This cold plate 1 can increase the flow amount of the heat-transfer medium at both the outer portions of the heat-transfer-medium flow space 2 in the width direction with respect to the central portion of the heat-transfer-medium flow space 2 in the width direction. Further, as illustrated in FIG. 10D, the cover plate 20 may be formed such that the thickness dimension is larger at both the outer portions of the heat-transfer-medium flow space 2 in the width direction than at the central portion of the heat-transfer-medium flow space 2 in the width direction and such that, the tips of the heat transfer portions 14 positioned on at both the outer portions of the heat-transfer-medium flow space 2 in the width direction may be inserted into the concave portions 22. This cold plate 1 can increase the flow amount of the heat-transfer medium at the central portion of the heat-transfer-medium flow space 2 in the width direction with respect to both the outer portions of the heat-transfer-medium flow space 2 in the width direction.

Figure 10E:
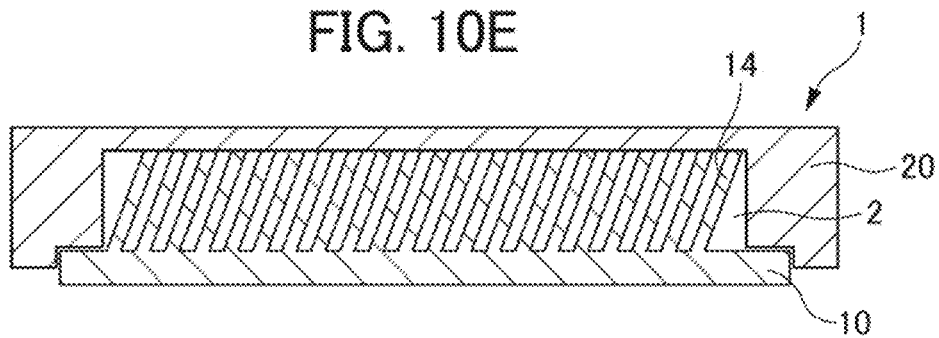

The above embodiment has described that the heat transfer portions 14 extend in a perpendicular direction from the heat dissipation surface 13, but the present disclosure is not limited thereto. The heat transfer portions 14 may extend obliquely from the heat dissipation surface 13 toward the cover plate 20, for example, as illustrated in FIG. 10E, provided that the heat transfer portions 14 extend from the heat dissipation surface 13 toward the cover plate 20.

The above embodiment has described water as an example of the heat-transfer medium, but the present disclosure is not limited thereto. For example, an antifreeze liquid containing ethylene glycol or a refrigerant gas such as hydrofluorocarbon (HFC) may be used as the heat-transfer medium.

The above-described embodiment has described the plurality of heat transfer portions 14 each configured as a fin that extends in the flow direction of the heat-transfer medium flowing through the heat-transfer-medium flow space 2, but the present disclosure is not limited thereto. The heat transfer portion 14 only has to have a shape protruding from the heat dissipation surface 13 toward the cover plate 20 in the heat-transfer-medium flow space 2, and may, for example, be a conical protrusion protruding from the heat dissipation surface 13 toward the cover plate 20.

The above embodiment has described the cover plate 20 that is joinable to the base plate 10 by brazing, but the present disclosure is not limited thereto. The cover plate 20 may be joined to the base plate 10 by diffusion bonding, friction stir welding (FSW), or pressure welding.

EXPLANATION OF REFERENCE NUMERALS 1 cold plate
2 heat-transfer-medium flow space
10 base plate
11 base-side joining portion
12 heat absorbing surface
13 heat dissipation surface
14 heat transfer portion
20 cover plate
22 concave portion

What is claimed is:

1. A cold plate that has therein a heat-transfer-medium flow space, through which a heat-transfer medium flows, and that releases, to the heat-transfer medium flowing through the heat-transfer-medium flow space, heat absorbed from an object to be cooled, the cold plate comprising:
   a base plate provided with, on a surface, a heat absorbing surface that absorbs heat released from the object to be cooled and provided with, on another surface, a heat dissipation surface that releases, to the heat-transfer medium flowing through the heat-transfer-medium flow space, the heat absorbed by the heat absorbing surface; and
   a cover plate that covers the heat dissipation surface of the base plate, wherein
   the heat-transfer-medium flow space is formed between the heat dissipation surface of the base plate and the cover plate,
   the base plate has a plurality of heat transfer portions that are provided so as to protrude from the heat dissipation surface toward the cover plate and that transfer, to the heat-transfer medium flowing through the heat-transfer-medium flow space, the heat released from the heat dissipation surface, and
   concave portions are formed in a surface of the cover plate facing the heat-transfer-medium flow space, wherein tips of at least some of the heat transfer portions are inserted respectively into the concave portions, and each of the tips of said at least some of the heat transfer portions corresponds to its own concave portions,
   the base plate has a base-side joining portion that is provided so as to extend along an outer periphery of the base plate and to which the cover plate is joined, and
   the heat dissipation surface protrudes further toward the cover plate than the base-side joining portion.

2. The cold plate according to claim 1, wherein
tip portions of the heat transfer portions have a tapered shape.

3. The cold plate according to claim 1, wherein
each of the plurality of heat transfer portions is configured as a fin that extends along a flow direction of the heat-transfer medium flowing through the heat-transfer-medium flow space.

4. A method of manufacturing a cold plate that has therein a heat-transfer-medium flow space, through which a heat-transfer medium flows, and that releases, to the heat-transfer medium flowing through the heat-transfer-medium flow space, heat absorbed from an object to be cooled, the method comprising:
   a plate stacking step of stacking, on a base plate, a cover plate that covers a heat dissipation surface, the base plate being provided with, on a surface, a heat absorbing surface that absorbs heat released from the object to be cooled, being provided with, on another surface, the heat dissipation surface that releases, to the heat-transfer medium flowing through the heat-transfer-medium flow space, heat absorbed by the heat absorbing surface, and being provided with a plurality of heat transfer portions that are provided so as to protrude from the heat dissipation surface toward the cover plate and that transfer, to the heat-transfer medium flowing through the heat-transfer-medium flow space, the heat released from the heat dissipation surface; and
   a plate pressing step of pushing at least a portion of tips of the plurality of heat transfer portions into a surface of the cover plate facing the heat dissipation surface and positioning at least the portion of the tips of the heat transfer portions into concave portions by pressing the base plate and the cover plate against each other in a state in which the cover plate has been stacked on the base plate in the plate stacking step, a base-side joining portion forming step of forming a base-side joining portion so as to extend along an outer periphery of the base plate and to protrude less than the heat dissipation surface toward the cover plate, and a joining step of joining the cover plate to the base-side joining portion.

5. The method of manufacturing the cold plate according to claim 4, further comprising:

a heat transfer portion forming step of forming tip portions of the heat transfer portions into a tapered shape.

6. The method of manufacturing the cold plate according to claim 4, further comprising:

a heat transfer portion forming step of forming the plurality of heat transfer portions into fin shapes that extend along a flow direction of the heat-transfer medium flowing through the heat-transfer-medium flow space.

\* \* \* \* \*